(12) United States Patent
Yang et al.

(10) Patent No.: US 12,279,504 B2
(45) Date of Patent: Apr. 15, 2025

(54) DISPLAY PANEL AND FABRICATING METHOD THEREOF, AND DISPLAYING DEVICE

(71) Applicants: Chengdu BOE Optoelectronics Technology Co., Ltd., Chengdu (CN); BOE Technology Group Co., Ltd., Beijing (CN)

(72) Inventors: Jibum Yang, Beijing (CN); Myoungsoo Lee, Beijing (CN); Euiku Lee, Beijing (CN); Meishan Xu, Beijing (CN); Chao Kong, Beijing (CN); Na Li, Beijing (CN); Haijun Qiu, Beijing (CN); Fei Chen, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 912 days.

(21) Appl. No.: 17/348,882

(22) Filed: Jun. 16, 2021

(65) Prior Publication Data

US 2022/0157892 A1 May 19, 2022

(30) Foreign Application Priority Data

Nov. 18, 2020 (CN) .......................... 202011296643.7

(51) Int. Cl.
*H10K 59/38* (2023.01)
*H10K 10/00* (2023.01)
(Continued)

(52) U.S. Cl.
CPC ........... *H10K 59/38* (2023.02); *H10K 50/865* (2023.02); *H10K 59/122* (2023.02); *H10K 71/00* (2023.02); *H10K 59/1201* (2023.02)

(58) Field of Classification Search
CPC .... H10K 59/38; H10K 50/865; H10K 59/122; H10K 71/00; H10K 59/1201; H10K 2102/3026; H10K 59/8792
See application file for complete search history.

(56) References Cited

U.S. PATENT DOCUMENTS

2012/0086332 A1 4/2012 Matsui et al.
2014/0116614 A1* 5/2014 Fukai ................. H10K 50/8426
156/272.8
(Continued)

FOREIGN PATENT DOCUMENTS

CN 102461333 A 5/2012
CN 111293149 A 6/2020
(Continued)

OTHER PUBLICATIONS

CN202011296643.7 first office action and search report.

*Primary Examiner* — Herve-Louis Y Assouman
(74) *Attorney, Agent, or Firm* — IPro, PLLC

(57) ABSTRACT

A display panel and a fabricating method thereof, and a displaying device. The display panel includes: a driving backplane, a light-emitting-device layer provided on the driving backplane, and a packaging layer, a color-film layer and a light absorbing layer provided on one side of the light-emitting-device layer that is further away from the driving backplane; wherein the light absorbing layer is configured for absorbing light rays of a specific wavelength in external-environment light and in light rays emitted by the light-emitting-device layer; and the specific wavelength includes at least one of a wavelength between a red-light wave band and a green-light wave band, a wavelength between a green-light wave band and a blue-light wave band, a wavelength shorter than a blue-light wave band and a wavelength longer than a red-light wave band.

15 Claims, 5 Drawing Sheets

(51) Int. Cl.
*H10K 50/86* (2023.01)
*H10K 59/12* (2023.01)
*H10K 59/122* (2023.01)
*H10K 59/80* (2023.01)
*H10K 71/00* (2023.01)

(56) References Cited

U.S. PATENT DOCUMENTS

2014/0284572 A1* 9/2014 Oooka .................. H10K 59/38
 257/40
2019/0302519 A1* 10/2019 Park ....................... G02B 5/201
2022/0140017 A1 5/2022 Yu

FOREIGN PATENT DOCUMENTS

CN 111628109 A 9/2020
JP 2000021570 A 1/2000

\* cited by examiner

DISPLAY PANEL AND FABRICATING METHOD THEREOF, AND DISPLAYING DEVICE

CROSS REFERENCE TO RELEVANT APPLICATIONS

The present disclosure claims the priority of the Chinese patent application filed on Nov. 18, 2020 before the Chinese Patent Office with the application number of 202011296643.7 and the title of "DISPLAY PANEL AND FABRICATING METHOD THEREOF, AND DISPLAYING DEVICE", which is incorporated herein in its entirety by reference.

TECHNICAL FIELD

The present disclosure relates to the technical field of displaying, and particularly relates to a display panel and a fabricating method thereof, and a displaying device.

BACKGROUND

With the development of the technique of displaying, Organic Light Emitting Diode (OLED) display panels, because of their advantages such as a low energy consumption, a low production cost, self-illumination, a wide visual angle and a high response speed, have been paid great attention by people.

SUMMARY

The present disclosure provides a display panel and a fabricating method thereof, and a displaying device.

The present disclosure discloses a display panel, wherein the display panel comprises:
 a driving backplane;
 a light-emitting-device layer, wherein the light-emitting-device layer is provided on the driving backplane; and
 a packaging layer, a color-film layer and a light absorbing layer, wherein the packaging layer, the color-film layer and the light absorbing layer are provided on one side of the light-emitting-device layer that is further away from the driving backplane;
 wherein the light absorbing layer is configured for absorbing light rays of a specific wavelength in external-environment light and in light rays emitted by the light-emitting-device layer; and
 the specific wavelength includes at least one of a wavelength between a red-light wave band and a green-light wave band, a wavelength between a green-light wave band and a blue-light wave band, a wavelength shorter than a blue-light wave band and a wavelength longer than a red-light wave band.

Optionally, the light absorbing layer comprises at least one color filtering layer; and
 when the light absorbing layer comprises at least two color filtering layers, wavelengths corresponding to light rays absorbed by any two of the color filtering layers are different.

Optionally, the specific wavelength further includes at least one of the following wavelengths: a wavelength in a first sub-wave band and a second sub-wave band in the red-light wave band, a wavelength in a third sub-wave band and a fourth sub-wave band in the green-light wave band, and a wavelength in a fifth sub-wave band and a sixth sub-wave band in the blue-light wave band.

Optionally, the packaging layer, the color-film layer and the light absorbing layer are sequentially further away from the light-emitting-device layer in a direction perpendicular to the light-emitting-device layer.

Optionally, the packaging layer, the light absorbing layer and the color-film layer are sequentially further away from the light-emitting-device layer in a direction perpendicular to the light-emitting-device layer.

Optionally, the color-film layer, the packaging layer and the light absorbing layer are sequentially further away from the light-emitting-device layer in a direction perpendicular to the light-emitting-device layer.

Optionally, the color-film layer, the light absorbing layer and the packaging layer are sequentially further away from the light-emitting-device layer in a direction perpendicular to the light-emitting-device layer.

Optionally, the light absorbing layer, the packaging layer and the color-film layer are sequentially further away from the light-emitting-device layer in a direction perpendicular to the light-emitting-device layer.

Optionally, the light absorbing layer, the color-film layer and the packaging layer are sequentially further away from the light-emitting-device layer in a direction perpendicular to the light-emitting-device layer.

Optionally, a material of the light absorbing layer is a material doped by a color filtering particle.

Optionally, the light-emitting-device layer comprises an anode layer provided on the driving backplane and a pixel defining layer provided on the anode layer, and the pixel defining layer has a plurality of opening regions; and
 the light-emitting-device layer further comprises an organic functional layer provided within the opening regions, and a cathode layer covering the pixel defining layer and the organic functional layer.

Optionally, a material of the pixel defining layer is a black light shielding material.

Optionally, the light-emitting-device layer further comprises a light shielding layer provided between the pixel defining layer and the cathode layer, and the light shielding layer is located on a surface of one side of the pixel defining layer that is further away from the driving backplane; and
 a material of the light shielding layer is a black light shielding material.

Optionally, the color-film layer comprises a plurality of color-film units, and each of the color-film units comprises a color-resistor unit and a black matrix encircling the color-resistor unit; and
 an orthographic projection of the color-resistor unit on the driving backplane covers an orthographic projection of the organic functional layer within a corresponding instance of the opening regions on the driving backplane, and an orthographic projection of the black matrix on the driving backplane is located within an orthographic projection on the driving backplane of a peripheral region between two neighboring instances of the opening regions.

Optionally, the color-resistor unit comprises a first color-resistor unit, a second color-resistor unit and a third color-resistor unit; and
 the first color-resistor unit permits a red light to pass through, the second color-resistor unit permits a green light to pass through, and the third color-resistor unit permits a blue light to pass through.

The present disclosure further discloses a method for fabricating a display panel, wherein the method comprises:
 providing a driving backplane;

forming a light-emitting-device layer on the driving backplane; and forming a packaging layer, a color-film layer and a light absorbing layer on one side of the light-emitting-device layer that is further away from the driving backplane;

wherein the light absorbing layer is configured for absorbing light rays of a specific wavelength in external-environment light and in light rays emitted by the light-emitting-device layer; and the specific wavelength includes at least one of a wavelength between a red-light wave band and a green-light wave band, a wavelength between a green-light wave band and a blue-light wave band, a wavelength shorter than a blue-light wave band and a wavelength longer than a red-light wave band.

Optionally, the step of forming the packaging layer, the color-film layer and the light absorbing layer on the one side of the light-emitting-device layer that is further away from the driving backplane comprises:

forming sequentially the packaging layer, the color-film layer and the light absorbing layer on the one side of the light-emitting-device layer that is further away from the driving backplane; or, forming sequentially the packaging layer, the light absorbing layer and the color-film layer on the one side of the light-emitting-device layer that is further away from the driving backplane; or, forming sequentially the color-film layer, the packaging layer and the light absorbing layer on the one side of the light-emitting-device layer that is further away from the driving backplane; or, forming sequentially the color-film layer, the light absorbing layer and the packaging layer on the one side of the light-emitting-device layer that is further away from the driving backplane; or, forming sequentially the light absorbing layer, the packaging layer and the color-film layer on the one side of the light-emitting-device layer that is further away from the driving backplane; or, forming sequentially the light absorbing layer, the color-film layer and the packaging layer on the one side of the light-emitting-device layer that is further away from the driving backplane.

Optionally, the step of forming the light-emitting-device layer on the driving backplane comprises:

forming an anode layer on the driving backplane;

forming a pixel defining layer on the anode layer, wherein the pixel defining layer has a plurality of opening regions;

forming an organic functional layer within the opening regions; and forming a cathode layer covering the pixel defining layer and the organic functional layer.

Optionally, after the step of forming the pixel defining layer on the anode layer, the method further comprises:

forming a light shielding layer on a surface of one side of the pixel defining layer that is further away from the driving backplane;

wherein the cathode layer further covers the light shielding layer, and a material of the light shielding layer is a black light shielding material.

The present disclosure further discloses a displaying device, wherein the displaying device comprises a cover plate and the display panel stated above; and the cover plate is provided on a light-exiting face of the display panel.

The above description is merely a summary of the technical solutions of the present disclosure. In order to more clearly know the elements of the present disclosure to enable the implementation according to the contents of the description, and in order to make the above and other purposes, features and advantages of the present disclosure more apparent and understandable, the particular embodiments of the present disclosure are provided below.

BRIEF DESCRIPTION OF THE DRAWINGS

In order to more clearly illustrate the technical solutions of the embodiments of the present disclosure or the related art, the figures that are required to describe the embodiments or the related art will be briefly introduced below. Apparently, the figures that are described below are merely embodiments of the present disclosure, and a person skilled in the art can obtain other figures according to these figures without paying creative work.

DETAILED DESCRIPTION

In order to make the above purposes, features and advantages of the present disclosure more apparent and understandable, the present disclosure will be described in further detail below with reference to the drawings and the particular embodiments. Apparently, the described embodiments are merely certain embodiments of the present disclosure, rather than all of the embodiments. All of the other embodiments that a person skilled in the art obtains on the basis of the embodiments of the present disclosure without paying creative work fall within the protection scope of the present disclosure.

Figure 1:
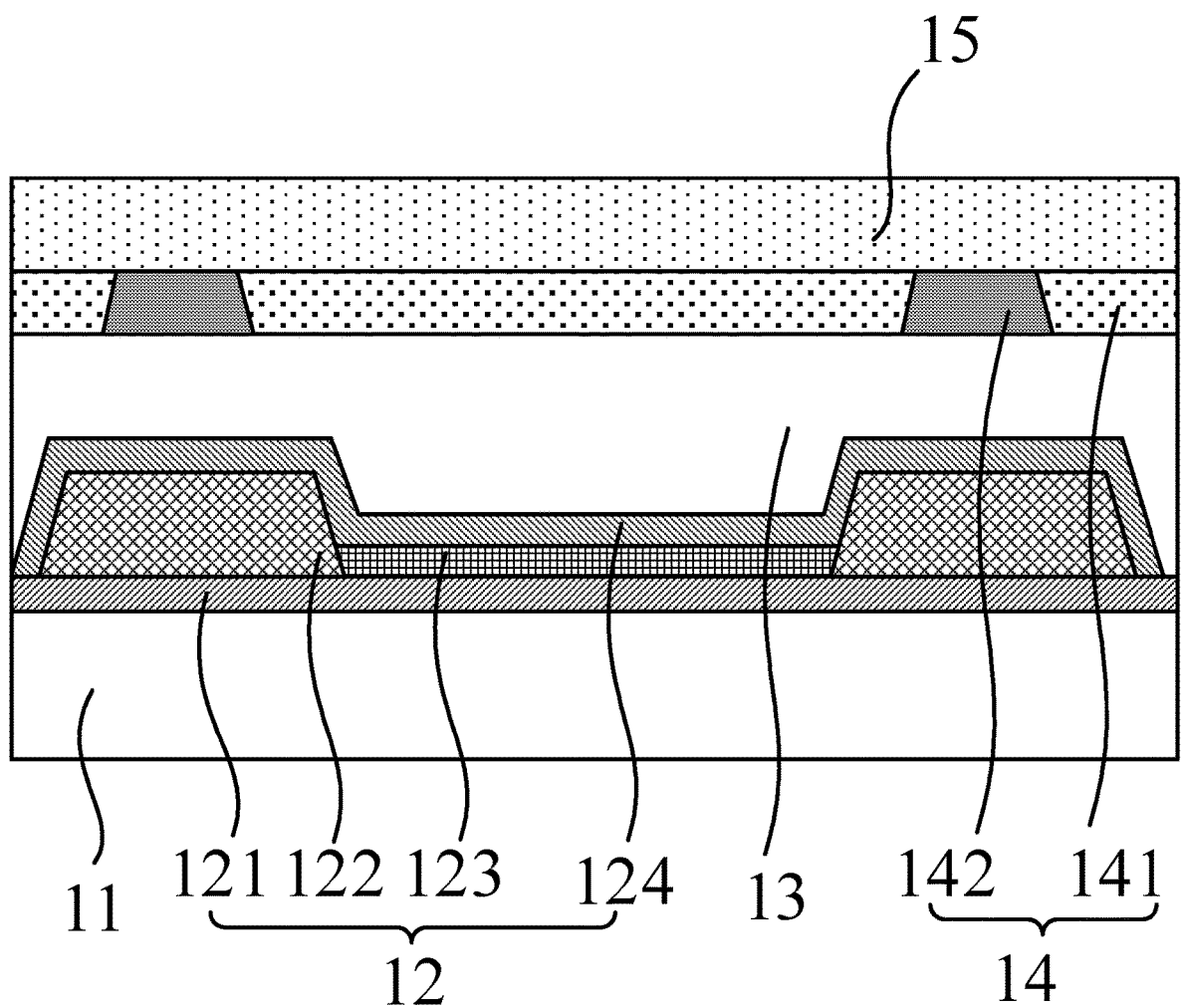
FIG. 1 shows a schematic structural diagram of the display panel according to an embodiment of the present disclosure.
Figure 2:
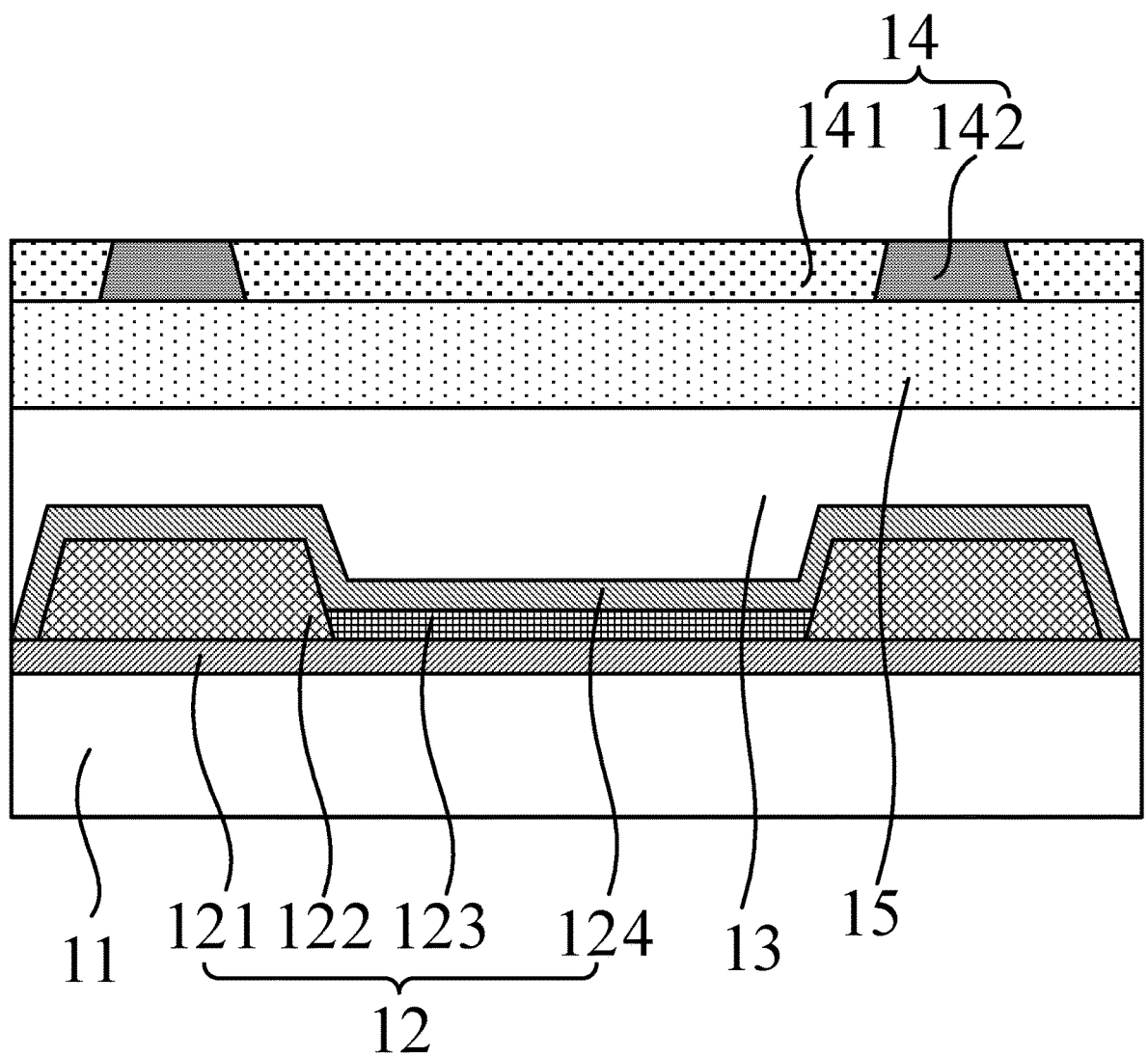
FIG. 2 shows a schematic structural diagram of the display panel according to another embodiment of the present disclosure.
Figure 3:
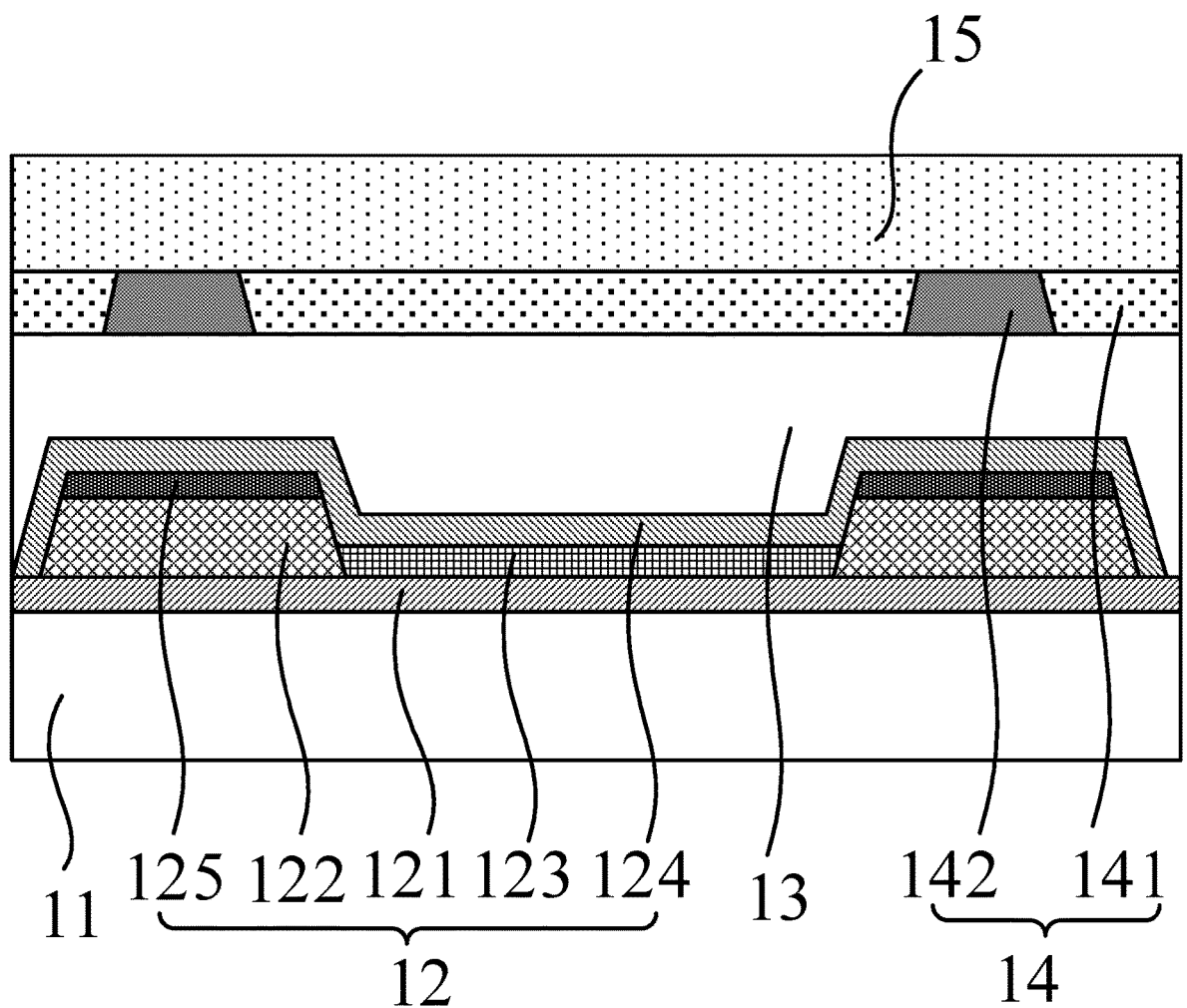
FIG. 3 shows a schematic structural diagram of the display panel according to yet another embodiment of the present disclosure.

FIG. 1 shows a schematic structural diagram of the display panel according to an embodiment of the present disclosure. FIG. 2 shows a schematic structural diagram of the display panel according to another embodiment of the present disclosure. FIG. 3 shows a schematic structural diagram of the display panel according to yet another embodiment of the present disclosure.

An embodiment of the present disclosure provides a display panel, wherein the display panel comprises: a driving backplane 11, a light-emitting-device layer 12 provided on the driving backplane 11, and a packaging layer 13, a color-film layer 14 and a light absorbing layer 15 that are provided on one side of the light-emitting-device layer 12 that is further away from the driving backplane 11. The light absorbing layer 15 is configured for absorbing light rays of a specific wavelength in external-environment light and in light rays emitted by the light-emitting-device layer 12. The specific wavelength includes at least one of a wavelength between a red-light wave band and a green-light wave band, a wavelength between a green-light wave band and a blue-light wave band, a wavelength shorter than a blue-light wave band and a wavelength longer than a red-light wave band.

In the practical product, the driving backplane 11 comprises a substrate, an active layer provided on the substrate, a grid insulating layer covering the substrate and the active layer, a grid layer provided on the grid insulating layer, an inter-layer-medium layer covering the grid layer and the grid insulating layer, a source-drain electrode layer provided on the inter-layer-medium layer, a passivation layer covering the source-drain electrode layer and the inter-layer-medium layer, and a flat layer provided on the passivation layer.

The grid layer comprises grid lines distributed in the row direction of the display panel, and grids of the transistors. The grid lines and the grids of the transistors are provided in the same layer. The grid lines are connected to the grids of the transistors. The source-drain electrode layer comprises data lines distribute in the column direction of the display panel, and the sources and the drains of the transistors. The data lines, the sources of the transistors and the drains of the transistors are provided in the same layer. The data lines are connected to the sources of the transistors. The sources are connected to the active layer via a first via hole penetrating the inter-layer-medium layer and the grid insulating layer. The drains are connected to the active layer via a second via hole penetrating the inter-layer-medium layer and the grid insulating layer.

It should be noted that the particular structure of the driving backplane 11 is not limited to the above structure, and may also be other structures, as long as it is a structure that can drive the light-emitting-device layer 12 to emit light, which is not limited in the embodiments of the present disclosure.

Moreover, a light-emitting-device layer 12 is provided on the driving backplane 11. A packaging layer 13, a color-film layer 14 and a light absorbing layer 15 are provided on the one side of the light-emitting-device layer 12 that is further away from the driving backplane 11.

The light-emitting-device layer 12 comprises an anode layer 121 provided on the driving backplane 11 and a pixel defining layer 122 provided on the anode layer 121. The pixel defining layer 122 has a plurality of opening regions. The light-emitting-device layer 12 further comprises an organic functional layer 123 provided within the opening regions, and a cathode layer 124 covering the pixel defining layer 122 and the organic functional layer 123.

The organic functional layer 123 may comprise merely a luminescent layer, and may further comprise film layers such as a hole injection layer, a hole transporting layer, a luminescent layer, an electron transporting layer and an electron injection layer. The anode layer 121, the pixel defining layer 122, the organic functional layer 123 and the cathode layer 124 in the light-emitting-device layer 12 together form the plurality of light emitting devices in the light-emitting-device layer 12, and the driving backplane 11 drives the light emitting devices with respect to whether to emit light and the emitted-light brightnesses, to realize the frame displaying of the display panel.

The packaging layer 13 is used for packaging the light-emitting-device layer 12 and the driving backplane 11, to prevent water and oxygen from entering the light-emitting-device layer 12 and the driving backplane 11 to result in the failure of the display panel. The packaging layer 13 may be a thin-film packaging structure, which comprises a first inorganic packaging layer, an organic packaging layer and a second inorganic packaging layer. Certainly, the packaging layer 13 may also comprise merely an organic packaging layer or an inorganic packaging layer, and the particular quantity of the organic packaging layers and the inorganic packaging layers may be one or more, which are not limited in the embodiments of the present disclosure.

The color-film layer 14 is used for performing color filtering to the external-environment light and the light rays emitted by the light-emitting-device layer 12. However, the spectrum width of the light rays that the color-film layer 14 permits to pass through is wide, and if merely the color-film layer 14 is provided in the display panel but the light absorbing layer 15 is not provided, that will result in that the light rays exiting from the light-exiting face of the display panel have a low color purity. Therefore, in the embodiment of the present disclosure, the light absorbing layer 15 is added in the display panel, and the light absorbing layer 15 absorbs the light rays of a specific wavelength in the external-environment light and in the light rays emitted by the light-emitting-device layer 12, to reduce the spectrum width of the light rays exiting from the light-exiting face of the display panel, whereby the color purity of the light rays exiting from the light-exiting face of the display panel is increased, thereby improving the displaying effect of the display panel, and preventing color cast of the display panel.

In other words, by providing the color-film layer 14 and the light absorbing layer 15 in the display panel, the directly incident external-environment light undergoes color filtering, to reduce the external-environment light that enters the light-emitting-device layer 12 and the driving backplane 11, i.e., reduce the external-environment light that enters the interior of the display panel. As the external-environment light that enters the interior of the display panel is reduced, the external-environment light has a smaller affection on the color purity of the light rays exiting from the light-exiting face of the display panel. Moreover, the external-environment light that passes through the color-film layer 14 and the light absorbing layer 15 and enters the interior of the display panel enters the light-emitting-device layer 12 and the driving backplane 11, and is reflected by the light-emitting-device layer 12 and the driving backplane 11. Particularly, it is reflected by the traces (such as the grid lines and the data lines) of the anode layer 121 in the light-emitting-device layer 12 and the driving backplane 11. The reflected external-environment light passes through the color-film layer 14 and the light absorbing layer 15 again, and the color-film layer 14 and the light absorbing layer 15 perform color filtering to the reflected external-environment light, thereby reducing the emergence of the reflected external-environment light from the light-exiting face of the display panel, to reduce the spectrum width of the external-environment light exiting from the light-exiting face of the display panel.

In addition, the light rays emitted by the light-emitting-device layer 12 also pass through the color-film layer 14 and the light absorbing layer 15, and the color-film layer 14 and the light absorbing layer 15 perform color filtering to the light rays emitted by the light-emitting-device layer 12, thereby reducing the spectrum width of the light rays emitted by the light-emitting-device layer 12 and exiting from the light-exiting face of the display panel.

The light absorbing layer 15 absorbs the light rays of a specific wavelength in the external-environment light and in the light rays emitted by the light-emitting-device layer 12. The specific wavelength includes at least one of a wavelength between a red-light wave band and a green-light wave band, a wavelength between a green-light wave band and a blue-light wave band, a wavelength shorter than a blue-light wave band and a wavelength longer than a red-light wave band.

Particularly, the wavelength between the red-light wave band and the green-light wave band refers to the wavelengths in the orange-light wave band and the yellow-light wave band, the wavelength between the green-light wave band and the blue-light wave band refers to the wavelengths in the cyan-light wave band, the wavelength shorter than the blue-light wave band refers to the wavelengths in the violet-light wave band and the wavelengths corresponding to ultraviolet light, and the wavelength longer than the red-light wave band refers to the wavelengths corresponding to infrared light.

For example, the wavelengths in the red-light wave band are 630 nm to 780 nm. The wavelengths in the orange-light wave band are 600 nm to 630 nm. The wavelengths in the yellow-light wave band are 570 nm to 600 nm. The wavelengths in the green-light wave band are 500 nm to 570 nm. The wavelengths in the cyan-light wave band are 470 nm to 500 nm. The wavelengths in the blue-light wave band are 420 nm to 470 nm. The wavelengths in the violet-light wave band are 380 nm to 420 nm. Therefore, the light rays of specific wavelengths absorbed by the light absorbing layer 15 include: at least one of an orange light of the wavelengths of 600 nm to 630 nm, a yellow light of the wavelengths of 570 nm to 600 nm, a cyan light of the wavelengths of 470 nm to 500 nm, a violet light of the wavelengths of 380 nm to 420 nm, an ultraviolet light of the wavelengths shorter than 380 nm, and an infrared light of the wavelengths longer than 780 nm.

It should be noted that, if the light rays of a specific wavelength absorbed by the light absorbing layer 15 have more types, the light rays exiting from the light-exiting face of the display panel have a higher color purity.

In an embodiment of the present disclosure, the light absorbing layer 15 comprises at least one color filtering layer; and when the light absorbing layer 15 comprises at least two color filtering layers, the wavelengths corresponding to the light rays absorbed by any two of the color filtering layers are different.

In the actual fabrication process, considering the requirements on the fabrication process, each of the color filtering layers of the light absorbing layer 15 can merely absorb the light rays of one color. Therefore, in order to absorb the light rays of a specific wavelength in the external-environment light and in the light rays emitted by the light-emitting-device layer 12, i.e., absorb at least one of the light rays corresponding to the wavelengths between the red-light wave band and the green-light wave band, the light rays corresponding to the wavelengths between the green-light wave band and the blue-light wave band, the light rays corresponding to the wavelengths shorter than the blue-light wave band and the light rays corresponding to the wavelengths longer than the red-light wave band, at least one color filtering layer is required to be provided.

Furthermore, and when the light absorbing layer 15 comprises at least two color filtering layers, by configuring the wavelengths corresponding to the light rays absorbed by any two of the color filtering layers to be different, more types of the light rays can be absorbed by the light absorbing layer 15, thereby further increasing the color purity of the light rays exiting from the light-exiting face of the display panel.

For example, the light absorbing layer 15 comprises 5 color filtering layers, which are a first color filtering layer, a second color filtering layer, a third color filtering layer, a fourth color filtering layer and a fifth color filtering layer. The first color filtering layer may absorb the light rays corresponding to the wavelengths between the red-light wave band and the green-light wave band. The second color filtering layer may absorb the light rays corresponding to the wavelengths between the green-light wave band and the blue-light wave band. The third color filtering layer may absorb the light rays corresponding to the violet-light wave band. The fourth color filtering layer may absorb ultraviolet light. The fifth color filtering layer may absorb infrared light.

Optionally, the specific wavelength further includes at least one of the following wavelengths: a wavelength in a first sub-wave band and a second sub-wave band in the red-light wave band, a wavelength in a third sub-wave band and a fourth sub-wave band in the green-light wave band, and a wavelength in a fifth sub-wave band and a sixth sub-wave band in the blue-light wave band.

All of the wavelengths in the first sub-wave band are greater than or equal to a first preset wavelength. All of the wavelengths in the second sub-wave band are less than or equal to a second preset wavelength. All of the wavelengths in the third sub-wave band are greater than or equal to a third preset wavelength. All of the wavelengths in the fourth sub-wave band are less than or equal to a fourth preset wavelength. All of the wavelengths in the fifth sub-wave band are greater than or equal to a fifth preset wavelength. All of the wavelengths in the sixth sub-wave band are less than or equal to a sixth preset wavelength. Furthermore, each two of the first preset wavelength, the second preset wavelength, the third preset wavelength, the fourth preset wavelength, the fifth preset wavelength and the sixth preset wavelength are different, and the particular numerical values of the first preset wavelength, the second preset wavelength, the third preset wavelength, the fourth preset wavelength, the fifth preset wavelength and the sixth preset wavelength are set according to practical demands, and are not limited in the embodiments of the present disclosure.

For example, the first preset wavelength is 760 nm, and accordingly the wavelengths in the first sub-wave band are 760 nm to 780 nm. The second preset wavelength is 640 nm, and accordingly the wavelengths in the second sub-wave band are 630 nm to 640 nm. The third preset wavelength is 560 nm, and accordingly the wavelengths in the third sub-wave band are 560 nm to 570 nm. The fourth preset wavelength is 510 nm, and accordingly the wavelengths in the fourth sub-wave band are 500 nm to 510 nm. The fifth preset wavelength is 460 nm, and accordingly the wavelengths in the fifth sub-wave band are 460 nm to 470 nm. The sixth preset wavelength is 430 nm, and accordingly the wavelengths in the sixth sub-wave band are 420 nm to 430 nm.

By absorbing by using the light absorbing layer 15 the light rays corresponding to the wavelengths in the first sub-wave band and the second sub-wave band in the red-light wave band, the light rays corresponding to the wavelengths in the third sub-wave band and the fourth sub-wave band in the green-light wave band, and the light rays corresponding to the wavelengths in the fifth sub-wave band and the sixth sub-wave band in the blue-light wave band, i.e., by absorbing by using the light absorbing layer 15 the light rays in some of the wave bands in the red-light wave band, the green-light wave band and the blue-light wave band, the spectrum width of the light rays exiting from the light-exiting face of the display panel is further reduced, thereby increasing the color purity of the light rays exiting from the light-exiting face of the display panel.

Figure 4:
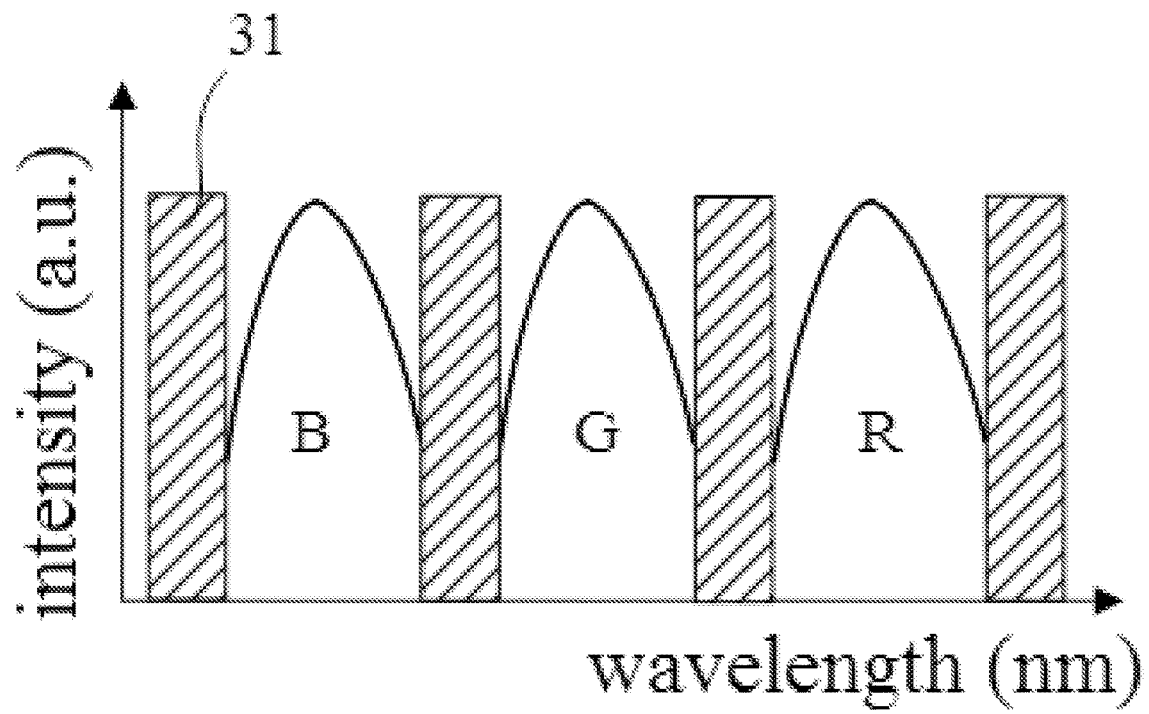
FIG. 4 shows a spectral distribution graph after the absorption of the light rays of a specific wavelength by the light absorbing layer according to an embodiment of the present disclosure.

After the light absorbing layer 15 has absorbed the light rays of a specific wavelength, a spectral distribution graph of the light rays exiting from the light-exiting face of the display panel is shown in FIG. 4, wherein the horizontal coordinate is the wavelength with the unit of nm, the vertical coordinate is the light intensity with the unit of a.u., as the light intensity is a relative intensity, and 31 is the light rays absorbed by the light absorbing layer 15. It can be seen that, after the light rays have passed through the light absorbing layer 15, the light rays corresponding to the wavelengths between the red-light wave band and the green-light wave band, the light rays corresponding to the wavelengths between the green-light wave band and the blue-light wave band, the light rays corresponding to the wavelengths shorter than the blue-light wave band, the light rays corresponding to the wavelengths longer than the red-light wave band, and the light rays in some of the wave bands in the red-light wave band, the green-light wave band and the blue-light wave band are absorbed by the light absorbing layer 15, and the spectrum width of the light rays exiting from the light-exiting face of the display panel is reduced.

Particularly, the light absorbing layer 15 may be a material doped by a color filtering particle. For example, it may be an organic material doped by a color filtering particle, and so on. The types of the materials of the light absorbing layer 15 may be selected according to practical demands, and are not limited in the embodiments of the present disclosure.

In the embodiments of the present disclosure, the particular positions of the packaging layer 13, the color-film layer 14 and the light absorbing layer 15 may have the following six different position configurations.

In the first position configuration, as shown in FIGS. 1 and 3, the packaging layer 13, the color-film layer 14 and the light absorbing layer 15 are sequentially further away from the light-emitting-device layer 12 in the direction perpendicular to the light-emitting-device layer 12.

In other words, the packaging layer 13 is provided on the one side of the light-emitting-device layer 12 that is further away from the driving backplane 11, the color-film layer 14 is provided on one side of the packaging layer 13 that is further away from the light-emitting-device layer 12, and the light absorbing layer 15 is provided on one side of the color-film layer 14 that is further away from the packaging layer 13.

In the second position configuration, as shown in FIG. 2, the packaging layer 13, the light absorbing layer 15 and the color-film layer 14 are sequentially further away from the light-emitting-device layer 12 in the direction perpendicular to the light-emitting-device layer 12.

In other words, the packaging layer 13 is provided on the one side of the light-emitting-device layer 12 that is further away from the driving backplane 11, the light absorbing layer 15 is provided on one side of the packaging layer 13 that is further away from the light-emitting-device layer 12, and the color-film layer 14 is provided on one side of the light absorbing layer 15 that is further away from the packaging layer 13.

In the third position configuration, the color-film layer 14, the packaging layer 13 and the light absorbing layer 15 are sequentially further away from the light-emitting-device layer 12 in the direction perpendicular to the light-emitting-device layer 12.

In other words, the color-film layer 14 is provided on the one side of the light-emitting-device layer 12 that is further away from the driving backplane 11, the packaging layer 13 is provided on one side of the color-film layer 14 that is further away from the light-emitting-device layer 12, and the light absorbing layer 15 is provided on one side of the packaging layer 13 that is further away from the color-film layer 14.

In the fourth position configuration, the color-film layer 14, the light absorbing layer 15 and the packaging layer 13 are sequentially further away from the light-emitting-device layer 12 in the direction perpendicular to the light-emitting-device layer 12.

In other words, the color-film layer 14 is provided on the one side of the light-emitting-device layer 12 that is further away from the driving backplane 11, the light absorbing layer 15 is provided on one side of the color-film layer 14 that is further away from the light-emitting-device layer 12, and the packaging layer 13 is provided on one side of the light absorbing layer 15 that is further away from the color-film layer 14.

In the fifth position configuration, the light absorbing layer 15, the packaging layer 13 and the color-film layer 14 are sequentially further away from the light-emitting-device layer 12 in the direction perpendicular to the light-emitting-device layer 12.

In other words, the light absorbing layer 15 is provided on the one side of the light-emitting-device layer 12 that is further away from the driving backplane 11, the packaging layer 13 is provided on one side of the light absorbing layer 15 that is further away from the light-emitting-device layer 12, and the color-film layer 14 is provided on one side of the packaging layer 13 that is further away from the light absorbing layer 15.

In the sixth position configuration, the light absorbing layer 15, the color-film layer 14 and the packaging layer 13 are sequentially further away from the light-emitting-device layer 12 in the direction perpendicular to the light-emitting-device layer 12.

In other words, the light absorbing layer 15 is provided on the one side of the light-emitting-device layer 12 that is further away from the driving backplane 11, the color-film layer 14 is provided on one side of the light absorbing layer 15 that is further away from the light-emitting-device layer 12, and the packaging layer 13 is provided on one side of the color-film layer 14 that is further away from the light absorbing layer 15.

In an optional embodiment of the present disclosure, the material of the pixel defining layer 122 is a black light shielding material. For example, the material of the pixel defining layer 122 may be a black resin material and so on.

By fabricating the pixel defining layer 122 by using a black light shielding material, the pixel defining layer 122 can absorb the external-environment light entering the pixel defining layer 122, which further reduces the external-environment light entering the anode layer 121 and the driving backplane 11, and, therefore, the external-environment light exiting from the light-exiting face of the display panel is correspondingly reduced, thereby further increasing the color purity of the light rays exiting from the light-exiting face of the display panel.

In another optional embodiment of the present disclosure, As shown in FIG. 3, the light-emitting-device layer 12 further comprises a light shielding layer 125 provided between the pixel defining layer 122 and the cathode layer 124, and the light shielding layer 125 is located on the surface of one side of the pixel defining layer 122 that is further away from the driving backplane 11. The material of the light shielding layer 125 is a black light shielding material. For example, the material of the light shielding layer 125 may be molybdenum oxide MoOx or a black resin material and so on.

By adding the light shielding layer 125 between the pixel defining layer 122 and the cathode layer 124, and fabricating the light shielding layer 125 by using a black light shielding material, the light shielding layer 125 can absorb the external-environment light entering the light shielding layer 125, which further reduces the external-environment light entering the anode layer 121 and the driving backplane 11, and, therefore, the external-environment light exiting from the light-exiting face of the display panel is correspondingly reduced, thereby further increasing the color purity of the light rays exiting from the light-exiting face of the display panel.

In an embodiment of the present disclosure, the color-film layer 14 comprises a plurality of color-film units, and each of the color-film units comprises a color-resistor unit 141 and a black matrix 142 encircling the color-resistor unit 141. The orthographic projection of the color-resistor unit 141 on the driving backplane 11 covers the orthographic projection of the organic functional layer 123 within the corresponding opening region on the driving backplane 11, and the orthographic projection of the black matrix 142 on the driving backplane 11 is located within the orthographic projection on the driving backplane 11 of a peripheral region between two neighboring opening regions.

In other words, the orthographic projection of the black matrix 142 on the driving backplane 11 is located within the orthographic projection of the pixel defining layer 122 on the driving backplane 11.

The color-resistor units 141 in the color-film layer 14 may be classified into 3 types, which are a first color-resistor unit, a second color-resistor unit and a third color-resistor unit. The first color-resistor unit permits a red light to pass through, the second color-resistor unit permits a green light to pass through, and the third color-resistor unit permits a blue light to pass through.

However, in the practical product, the spectrum width of the light rays that the color-film layer 14 permits to pass through is wide, which results in that, among the light rays that pass through the color-film layer 14, besides the light rays that it permits to pass through, light rays of other colors also pass through it. For example, besides the red light, which the first color-resistor unit permits to pass through it, some orange light passes through the first color-resistor unit. Therefore, in the embodiment of the present disclosure, by adding the light absorbing layer 15, the light rays are further filtered, to reduce the spectrum width of the light rays exiting from the light-exiting face of the display panel.

By filtering the external-environment light by using both of the color-film layer 14 and the light absorbing layer 15, the external-environment light exiting from the light-exiting face of the display panel is reduced, thereby preventing the external-environment light from affecting the color purity of the light rays exiting from the light-exiting face of the display panel. Correspondingly, because the external-environment light exiting from the light-exiting face of the display panel is lesser, the reflectivity of the external-environment light is reduced. It is measured by experimentation that the color-film layer 14 and the light absorbing layer 15 according to the embodiments of the present disclosure can enable the reflectivity of the external-environment light to be less than 6%, thereby increasing the contrast of the display panel.

In the embodiments of the present disclosure, the light absorbing layer is added in the display panel, and the light absorbing layer absorbs the light rays of a specific wavelength in the external-environment light and in the light rays emitted by the light-emitting-device layer, to reduce the spectrum width of the light rays exiting from the light-exiting face of the display panel, whereby the color purity of the light rays exiting from the light-exiting face of the display panel is increased, thereby improving the displaying effect of the display panel, and preventing color cast of the display panel.

Figure 5:
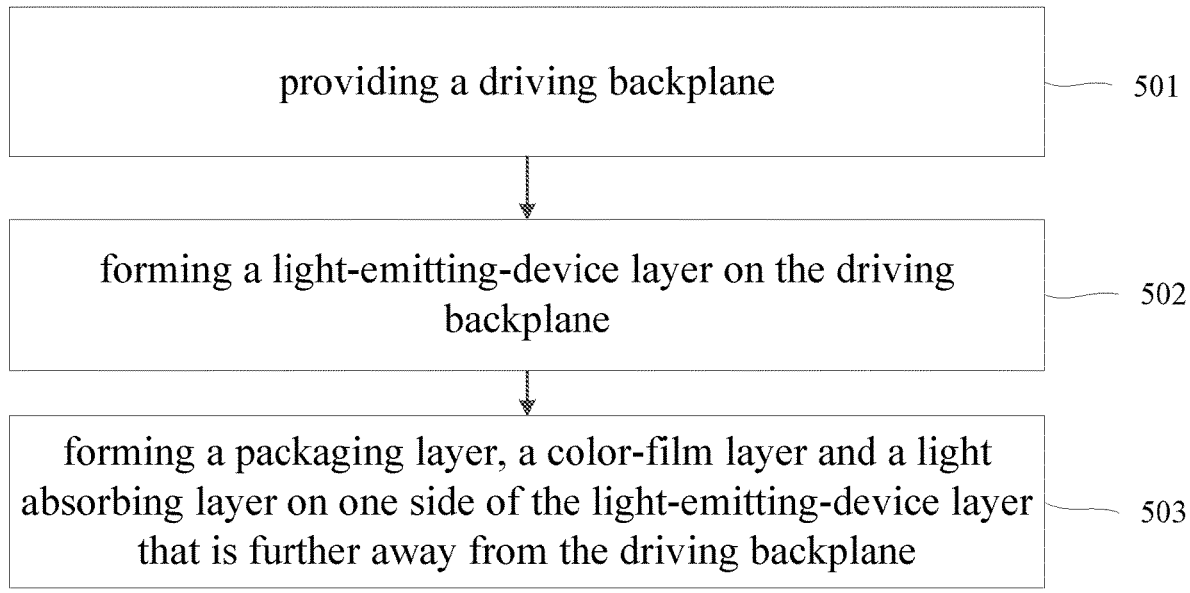
FIG. 5 shows a flow chart of the method for fabricating a display panel according to an embodiment of the present disclosure.

Referring to FIG. 5, FIG. 5 shows a flow chart of the method for fabricating a display panel according to an embodiment of the present disclosure, which may particularly comprise the following steps:

Step 501: providing a driving backplane.

In an embodiment of the present disclosure, firstly a driving backplane 11 for driving a light-emitting-device layer 12 to emit light is fabricated.

Particularly, this step comprises forming an active layer on a substrate by using a patterning process, forming a grid insulating layer covering the active layer and the substrate, forming a grid layer on the grid insulating layer by using a patterning process, and forming an inter-layer-medium layer covering the grid layer and the grid insulating layer; subsequently, forming a first via hole and a second via hole that penetrate the inter-layer-medium layer and the grid insulating layer; subsequently, forming a source-drain electrode layer on the inter-layer-medium layer by using a patterning process, wherein the source-drain electrode layer comprises data lines, and the sources and the drains of transistors, and the sources are connected to the active layer via a first via hole penetrating the inter-layer-medium layer and the grid insulating layer, and the drains are connected to the active layer via a second via hole penetrating the inter-layer-medium layer and the grid insulating layer; and, finally, forming a passivation layer covering the source-drain electrode layer and the inter-layer-medium layer, and forming a flat layer on the passivation layer, to obtain the driving backplane 11.

Step 502: forming a light-emitting-device layer on the driving backplane.

In an embodiment of the present disclosure, after the driving backplane 11 has been obtained, a light-emitting-device layer 12 is formed on the driving backplane 11.

Particularly, the step 502 comprises a sub-step 5021 to a sub-step 5024:

Sub-step 5021: forming an anode layer on the driving backplane;

Sub-step 5022: forming a pixel defining layer on the anode layer, wherein the pixel defining layer has a plurality of opening regions;

Sub-step 5023: forming an organic functional layer within the opening regions; and Sub-step 5024: forming a cathode layer covering the pixel defining layer and the organic functional layer.

Firstly, an anode layer 121 is formed on the driving backplane 11 by using a patterning process. Particularly, the anode layer 121 is formed on the flat layer of the driving backplane 11, wherein the anode layer 121 is connected to the drains in the source-drain electrode layer by a third via hole penetrating the flat layer and the passivation layer.

Subsequently, a pixel defining layer 122 is formed on the anode layer 121, wherein the pixel defining layer has a plurality of opening regions.

Subsequently, an organic functional layer 123 is formed within the opening regions of the pixel defining layer 122, wherein the organic functional layer 123 contacts the anode layer 121. Particularly, the organic functional layer 123 may be formed within the opening regions of the pixel defining layer 122 by a printing process or a vapor-deposition process. The organic functional layer may comprise merely a luminescent layer, and may also comprise film layers sequentially provided on one side of the anode layer 121 that is further away from the driving backplane 11, such as a hole injection layer, a hole transporting layer, a luminescent layer, an electron transporting layer and an electron injection layer.

Finally, a cathode layer 124 covering the pixel defining layer 122 and the organic functional layer 123 is formed, wherein the material of the cathode layer 124 is an electrically conductive material having a high transmittance.

In order to further reduce the external-environment light exiting from the light-exiting face of the display panel, the pixel defining layer 122 may be fabricated by using a black light shielding material.

Optionally, after the sub-step 5022, the method further comprises: forming a light shielding layer on a surface of one side of the pixel defining layer that is further away from the driving backplane; wherein the cathode layer further covers the light shielding layer, and a material of the light shielding layer is a black light shielding material.

Certainly, in order to further reduce the external-environment light exiting from the light-exiting face of the display panel, the pixel defining layer 122 may also be fabricated by using a common light transmitting material. However, the light shielding layer 125 is required to be formed on the surface of one side of the pixel defining layer 122 that is further away from the driving backplane 11, and the material of the light shielding layer 125 is a black light shielding material.

In other words, after the pixel defining layer 122 has been formed on the anode layer 121, firstly the light shielding layer 125 is formed on the surface of the one side of the pixel defining layer 122 that is further away from the driving backplane 11, then the organic functional layer 123 is formed within the opening regions of the pixel defining layer 122, and finally the cathode layer 124 covering the pixel defining layer 122, the organic functional layer 123 and the light shielding layer 125 is formed, to obtain the light-emitting-device layer 12.

Step 503: forming a packaging layer, a color-film layer and a light absorbing layer on one side of the light-emitting-device layer that is further away from the driving backplane.

In an embodiment of the present disclosure, after the light-emitting-device layer 12 has been formed on the driving backplane 11, a packaging layer 13, a color-film layer 14 and a light absorbing layer 15 are formed on one side of the light-emitting-device layer 12 that is further away from the driving backplane 11.

The light absorbing layer 15 is configured for absorbing light rays of a specific wavelength in external-environment light and in light rays emitted by the light-emitting-device layer 12. The specific wavelength includes at least one of a wavelength between a red-light wave band and a green-light wave band, a wavelength between a green-light wave band and a blue-light wave band, a wavelength shorter than a blue-light wave band and a wavelength longer than a red-light wave band.

Particularly, in a first example, the step 503 particularly comprises: forming sequentially the packaging layer, the color-film layer and the light absorbing layer on the one side of the light-emitting-device layer that is further away from the driving backplane.

After the light-emitting-device layer 12 has been formed on the driving backplane 11, the packaging layer 13 is firstly formed on the one side of the light-emitting-device layer 12 that is further away from the driving backplane 11, then the color-film layer 14 is formed on one side of the packaging layer 13 that is further away from the light-emitting-device layer 12, and, finally, the light absorbing layer 15 is formed on one side of the color-film layer 14 that is further away from the packaging layer 13.

In a second example, the step 503 particularly comprises: forming sequentially the packaging layer, the light absorbing layer and the color-film layer on the one side of the light-emitting-device layer that is further away from the driving backplane.

After the light-emitting-device layer 12 has been formed on the driving backplane 11, the packaging layer 13 is firstly formed on the one side of the light-emitting-device layer 12 that is further away from the driving backplane 11, then the light absorbing layer 15 is formed on one side of the packaging layer 13 that is further away from the light-emitting-device layer 12, and, finally, the color-film layer 14 is formed on one side of the light absorbing layer 15 that is further away from the packaging layer 13.

In a third example, the step 503 particularly comprises: forming sequentially the color-film layer, the packaging layer and the light absorbing layer on the one side of the light-emitting-device layer that is further away from the driving backplane.

After the light-emitting-device layer 12 has been formed on the driving backplane 11, the color-film layer 14 is firstly formed on the one side of the light-emitting-device layer 12 that is further away from the driving backplane 11, then the packaging layer 13 is formed on one side of the color-film layer 14 that is further away from the light-emitting-device layer 12, and, finally, the light absorbing layer 15 is formed on one side of the packaging layer 13 that is further away from the color-film layer 14.

In a fourth example, the step 503 particularly comprises: forming sequentially the color-film layer, the light absorbing layer and the packaging layer on the one side of the light-emitting-device layer that is further away from the driving backplane.

After the light-emitting-device layer 12 has been formed on the driving backplane 11, the color-film layer 14 is firstly formed on the one side of the light-emitting-device layer 12 that is further away from the driving backplane 11, then the light absorbing layer 15 is formed on one side of the color-film layer 14 that is further away from the light-emitting-device layer 12, and, finally, the packaging layer 13 is formed on one side of the light absorbing layer 15 that is further away from the color-film layer 14.

In a fifth example, the step 503 particularly comprises: forming sequentially the light absorbing layer, the packaging layer and the color-film layer on the one side of the light-emitting-device layer that is further away from the driving backplane.

After the light-emitting-device layer 12 has been formed on the driving backplane 11, the light absorbing layer 15 is firstly formed on the one side of the light-emitting-device layer 12 that is further away from the driving backplane 11, then the packaging layer 13 is formed on one side of the light absorbing layer 15 that is further away from the light-emitting-device layer 12, and, finally, the color-film layer 14 is formed on one side of the packaging layer 13 that is further away from the light absorbing layer 15.

In a sixth example, the step 503 particularly comprises: forming sequentially the light absorbing layer, the color-film layer and the packaging layer on the one side of the light-emitting-device layer that is further away from the driving backplane.

After the light-emitting-device layer 12 has been formed on the driving backplane 11, the light absorbing layer 15 is firstly formed on the one side of the light-emitting-device layer 12 that is further away from the driving backplane 11, then the color-film layer 14 is formed on one side of the light absorbing layer 15 that is further away from the light-emitting-device layer 12, and, finally, the packaging layer 13 is formed on one side of the color-film layer 14 that is further away from the light absorbing layer 15.

It should be noted that the particular formation process of the light absorbing layer 15 is related to the employed material, and it may be formed by using a physical vapor deposition (PVD) process or a chemical vapor deposition (CVD) process.

In the embodiments of the present disclosure, the light absorbing layer is added in the display panel, and the light absorbing layer absorbs the light rays of a specific wavelength in the external-environment light and in the light rays emitted by the light-emitting-device layer, to reduce the spectrum width of the light rays exiting from the light-exiting face of the display panel, whereby the color purity of the light rays exiting from the light-exiting face of the display panel is increased, thereby improving the displaying effect of the display panel, and preventing color cast of the display panel.

Figure 6:
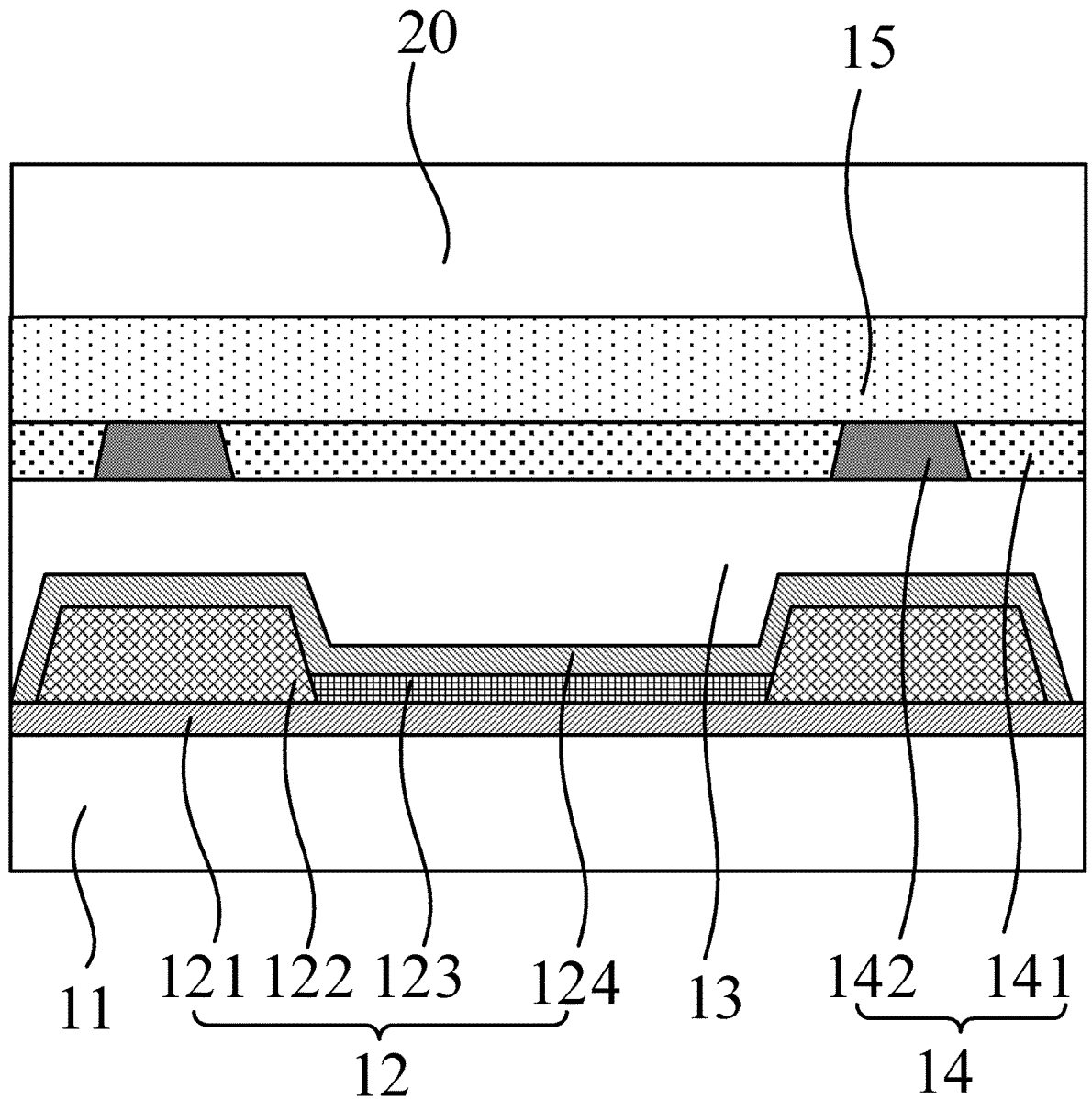
FIG. 6 shows a schematic structural diagram of the displaying device according to an embodiment of the present disclosure.

Referring to FIG. 6, FIG. 6 shows a schematic structural diagram of the displaying device according to an embodiment of the present disclosure.

An embodiment of the present disclosure provides a displaying device, wherein the displaying device comprises a cover plate 20 and the display panel stated above; and the cover plate 20 is provided on the light-exiting face of the display panel.

The cover plate 20 may be a glass cover plate for protecting the display panel. When the packaging layer 13, the color-film layer 14 and the light absorbing layer 15 are provided sequentially on the one side of the light-emitting-device layer 12 that is further away from the driving backplane 11, the cover plate 20 is provided on one side of the light absorbing layer 15 that is further away from the color-film layer 14. When the packaging layer 13, the light absorbing layer 15 and the color-film layer 14 are provided sequentially on the one side of the light-emitting-device layer 12 that is further away from the driving backplane 11, the cover plate 20 is provided on one side of the color-film layer 14 that is further away from the light absorbing layer 15. When the color-film layer 14, the packaging layer 13 and the light absorbing layer 15 are provided sequentially on the one side of the light-emitting-device layer 12 that is further away from the driving backplane 11, the cover plate 20 is provided on one side of the light absorbing layer 15 that is further away from the packaging layer 13. When the color-film layer 14, the light absorbing layer 15 and the packaging layer 13 are provided sequentially on the one side of the light-emitting-device layer 12 that is further away from the driving backplane 11, the cover plate 20 is provided on one side of the packaging layer 13 that is further away from the light absorbing layer 15. When the light absorbing layer 15, the packaging layer 13 and the color-film layer 14 are provided sequentially on the one side of the light-emitting-device layer 12 that is further away from the driving backplane 11, the cover plate 20 is provided on one side of the color-film layer 14 that is further away from the packaging layer 13. When the light absorbing layer 15, the color-film layer 14 and the packaging layer 13 are provided sequentially on the one side of the light-emitting-device layer 12 that is further away from the driving backplane 11, the cover plate 20 is provided on one side of the packaging layer 13 that is further away from the color-film layer 14.

The particular description on the display panel may refer to the description on the above embodiments, and is not discussed further in the embodiments of the present disclosure.

Moreover, the displaying device further comprises other functional devices such as a touch-controlling panel and a fingerprint-identification device. They may be provided between the cover plate 20 and the display panel. Certainly, they may also be provided at other positions, which is not limited in the embodiments of the present disclosure.

In practical applications, the displaying device may be any products or components that have the function of displaying, such as a mobile phone, a tablet personal computer, a display, a notebook computer and a navigator.

In the embodiments of the present disclosure, the light absorbing layer is added in the display panel, and the light absorbing layer absorbs the light rays of a specific wavelength in the external-environment light and in the light rays emitted by the light-emitting-device layer, to reduce the spectrum width of the light rays exiting from the light-exiting face of the display panel, whereby the color purity of the light rays exiting from the light-exiting face of the display panel is increased, thereby improving the displaying effect of the display panel, and preventing color cast of the display panel.

Regarding the above-described process embodiments, for brevity of the description, all of them are expressed as the combination of a series of actions, but a person skilled in the art should know that the present disclosure is not limited by the sequences of the actions that are described, because, according to the present disclosure, some of the steps may have other sequences or be performed simultaneously. Secondly, a person skilled in the art should also know that all of the embodiments described in the description are preferable embodiments, and not all of the actions and the modules that they involve are required by the present disclosure.

The embodiments of the description are described in the mode of progression, each of the embodiments emphatically describes the differences from the other embodiments, and the same or similar parts of the embodiments may refer to each other.

Finally, it should also be noted that, in the present text, relation terms such as first and second are merely intended to distinguish one entity or operation from another entity or operation, and that does not necessarily require or imply that those entities or operations have therebetween any such actual relation or order. Furthermore, the terms "include", "comprise" or any variants thereof are intended to cover non-exclusive inclusions, so that processes, methods, articles or devices that include a series of elements do not only include those elements, but also include other elements that are not explicitly listed, or include the elements that are inherent to such processes, methods, articles or devices. Unless further limitation is set forth, an element defined by the wording "comprising a . . . " does not exclude additional same element in the process, method, article or device comprising the element.

The display panel and the fabricating method thereof, and the displaying device according to the present disclosure have been described in detail above. The principle and the embodiments of the present disclosure are described herein with reference to the particular examples, and the description of the above embodiments is merely intended to facilitate to understand the method according to the present disclosure and its core concept. Moreover, for a person skilled in the art, according to the concept of the present disclosure, the particular embodiments and the range of application may be varied. In conclusion, the contents of the description should not be understood as limiting the present disclosure.

The invention claimed is:
1. A display panel, wherein the display panel comprises:
a driving backplane;
a light-emitting-device layer, wherein the light-emitting-device layer is provided on the driving backplane; and
a packaging layer, a color-film layer and a light absorbing layer, wherein the packaging layer, the color-film layer and the light absorbing layer are provided on one side of the light-emitting-device layer that is further away from the driving backplane;
wherein the light absorbing layer is configured for absorbing light rays of a specific wavelength in external-environment light and in light rays emitted by the light-emitting-device layer; and
the specific wavelength includes at least one of a wavelength between a red-light wave band and a green-light wave band, a wavelength between a green-light wave band and a blue-light wave band, a wavelength shorter than a blue-light wave band and a wavelength longer than a red-light wave band;
wherein the light-emitting-device layer comprises an anode layer provided on the driving backplane and a pixel defining layer provided on the anode layer, the pixel defining layer has a plurality of opening regions, and a material of the pixel defining layer is a black light shielding material;
the light-emitting-device layer further comprises an organic functional layer provided within the opening regions, and a cathode layer covering the pixel defining layer and the organic functional layer; and
the light-emitting-device layer further comprises a light shielding layer provided between the pixel defining layer and the cathode layer, and the light shielding layer is located on a surface of one side of the pixel defining layer that is further away from the driving backplane; and
a material of the light shielding layer is a black light shielding material.
2. The display panel according to claim 1, wherein the light absorbing layer comprises at least one color filtering layer; and
when the light absorbing layer comprises at least two color filtering layers, wavelengths corresponding to light rays absorbed by any two of the color filtering layers are different.
3. The display panel according to claim 1, wherein the specific wavelength further includes at least one of the following wavelengths: a wavelength in a first sub-wave band and a second sub-wave band in the red-light wave band, a wavelength in a third sub-wave band and a fourth sub-wave band in the green-light wave band, and a wavelength in a fifth sub-wave band and a sixth sub-wave band in the blue-light wave band.
4. The display panel according to claim 1, wherein the packaging layer, the color-film layer and the light absorbing layer are sequentially further away from the light-emitting-device layer in a direction perpendicular to the light-emitting-device layer.
5. The display panel according to claim 1, wherein the packaging layer, the light absorbing layer and the color-film layer are sequentially further away from the light-emitting-device layer in a direction perpendicular to the light-emitting-device layer.

6. The display panel according to claim 1, wherein the color-film layer, the packaging layer and the light absorbing layer are sequentially further away from the light-emitting-device layer in a direction perpendicular to the light-emitting-device layer.
7. The display panel according to claim 1, wherein the color-film layer, the light absorbing layer and the packaging layer are sequentially further away from the light-emitting-device layer in a direction perpendicular to the light-emitting-device layer.
8. The display panel according to claim 1, wherein the light absorbing layer, the packaging layer and the color-film layer are sequentially further away from the light-emitting-device layer in a direction perpendicular to the light-emitting-device layer.
9. The display panel according to claim 1, wherein the light absorbing layer, the color-film layer and the packaging layer are sequentially further away from the light-emitting-device layer in a direction perpendicular to the light-emitting-device layer.
10. The display panel according to claim 1, wherein a material of the light absorbing layer is a material doped by a color filtering particle.
11. The display panel according to claim 1, wherein the color-film layer comprises a plurality of color-film units, and each of the color-film units comprises a color-resistor unit and a black matrix encircling the color-resistor unit; and
an orthographic projection of the color-resistor unit on the driving backplane covers an orthographic projection of the organic functional layer within a corresponding instance of the opening regions on the driving backplane, and an orthographic projection of the black matrix on the driving backplane is located within an orthographic projection on the driving backplane of a peripheral region between two neighboring instances of the opening regions.
12. The display panel according to claim 11, wherein the color-resistor unit comprises a first color-resistor unit, a second color-resistor unit and a third color-resistor unit; and
the first color-resistor unit permits a red light to pass through, the second color-resistor unit permits a green light to pass through, and the third color-resistor unit permits a blue light to pass through.
13. A displaying device, wherein the displaying device comprises a cover plate and the display panel according to claim 1; and
the cover plate is provided on a light-exiting face of the display panel.
14. A method for fabricating a display panel, wherein the method comprises:
providing a driving backplane;
forming a light-emitting-device layer on the driving backplane; and
forming a packaging layer, a color-film layer and a light absorbing layer on one side of the light-emitting-device layer that is further away from the driving backplane;
wherein the light absorbing layer is configured for absorbing light rays of a specific wavelength in external-environment light and in light rays emitted by the light-emitting-device layer; and
the specific wavelength includes at least one of a wavelength between a red-light wave band and a green-light wave band, a wavelength between a green-light wave band and a blue-light wave band, a wavelength shorter than a blue-light wave band and a wavelength longer than a red-light wave band;

wherein the step of forming the light-emitting-device layer on the driving backplane comprises:

forming an anode layer on the driving backplane;

forming a pixel defining layer on the anode layer, wherein the pixel defining layer has a plurality of opening regions;

forming an organic functional layer within the opening regions; and forming a cathode layer covering the pixel defining layer and the organic functional layer;

after the step of forming the pixel defining layer on the anode layer, the method further comprises:

forming a light shielding layer on a surface of one side of the pixel defining layer that is further away from the driving backplane;

wherein the cathode layer further covers the light shielding layer, and a material of the light shielding layer is a black light shielding material.

15. The method for fabricating a display panel according to claim 14, wherein the step of forming the packaging layer, the color-film layer and the light absorbing layer on the one side of the light-emitting-device layer that is further away from the driving backplane comprises:

forming sequentially the packaging layer, the color-film layer and the light absorbing layer on the one side of the light-emitting-device layer that is further away from the driving backplane; or, forming sequentially the packaging layer, the light absorbing layer and the color-film layer on the one side of the light-emitting-device layer that is further away from the driving backplane; or, forming sequentially the color-film layer, the packaging layer and the light absorbing layer on the one side of the light-emitting-device layer that is further away from the driving backplane; or, forming sequentially the color-film layer, the light absorbing layer and the packaging layer on the one side of the light-emitting-device layer that is further away from the driving backplane; or, forming sequentially the light absorbing layer, the packaging layer and the color-film layer on the one side of the light-emitting-device layer that is further away from the driving backplane; or, forming sequentially the light absorbing layer, the color-film layer and the packaging layer on the one side of the light-emitting-device layer that is further away from the driving backplane.

* * * * *